(12) United States Patent
Wombacher et al.

(10) Patent No.: US 9,379,033 B2
(45) Date of Patent: Jun. 28, 2016

(54) SENSOR PACKAGE

(71) Applicant: Infineon Technologies AG, Neubiberg (DE)

(72) Inventors: Ralf Wombacher, Maxhuette-Haidhof (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 130 days.

(21) Appl. No.: 14/218,048

(22) Filed: Mar. 18, 2014

(65) Prior Publication Data

US 2014/0197503 A1 Jul. 17, 2014

Related U.S. Application Data

(63) Continuation of application No. 11/828,085, filed on Jul. 25, 2007, now Pat. No. 8,674,462.

(51) Int. Cl.
*H01L 23/29* (2006.01)
*H01L 23/055* (2006.01)
(Continued)

(52) U.S. Cl.
CPC ............ *H01L 23/291* (2013.01); *B81B 7/0025* (2013.01); *H01L 23/055* (2013.01); *H01L 23/298* (2013.01); *H01L 23/564* (2013.01); *H01L 24/34* (2013.01); *H01L 24/48* (2013.01); *H01L 24/83* (2013.01); *H01L 24/97* (2013.01); *H01L 24/45* (2013.01); *H01L 24/85* (2013.01); *H01L 2224/0401* (2013.01); *H01L 2224/05624* (2013.01); *H01L 2224/05669* (2013.01); *H01L 2224/16225* (2013.01); *H01L 2224/32225* (2013.01); *H01L 2224/45014* (2013.01); *H01L 2224/45124* (2013.01); *H01L 2224/45144* (2013.01); *H01L 2224/45147* (2013.01); *H01L 2224/484* (2013.01); *H01L 2224/48091* (2013.01); *H01L 2224/48247* (2013.01); *H01L 2224/48624* (2013.01); *H01L 2224/48669* (2013.01); *H01L 2224/48724* (2013.01);
(Continued)

(58) Field of Classification Search
CPC ...... H01L 23/28; H01L 29/291; H01L 29/298
USPC .......................................... 257/254, 415–419
See application file for complete search history.

(56) References Cited

U.S. PATENT DOCUMENTS 5,780,928 A 7/1998 Rostoker et al.
6,140,144 A 10/2000 Najafi et al.
(Continued)

FOREIGN PATENT DOCUMENTS

DE 4136987 5/1993
DE 10 2004 026 433 12/2005
(Continued)

OTHER PUBLICATIONS

Office Action mailed Jun. 18, 2010 in U.S. Appl. No. 11/828,085.

*Primary Examiner* — Cuong Q Nguyen
(74) *Attorney, Agent, or Firm* — Dicke, Billig & Czaja, PLLC

(57) ABSTRACT

A sensor package is disclosed. One embodiment provides a sensor device having a carrier, a semiconductor sensor mounted on the carrier and an active surface. Contact elements are electrically connecting the carrier with the semiconductor sensor. A protective layer made of an inorganic material covers at least the active surface and the contact elements.

19 Claims, 4 Drawing Sheets

(51) Int. Cl.
*H01L 23/00* (2006.01)
*B81B 7/00* (2006.01)

(52) U.S. Cl.
CPC .......... *H01L2224/48769* (2013.01); *H01L 2224/48824* (2013.01); *H01L 2224/48869* (2013.01); *H01L 2224/73265* (2013.01); *H01L 2224/8192* (2013.01); *H01L 2224/81951* (2013.01); *H01L 2224/83* (2013.01); *H01L 2224/8592* (2013.01); *H01L 2224/97* (2013.01); *H01L 2924/014* (2013.01); *H01L 2924/01007* (2013.01); *H01L 2924/01013* (2013.01); *H01L 2924/01014* (2013.01); *H01L 2924/01023* (2013.01); *H01L 2924/01028* (2013.01); *H01L 2924/01029* (2013.01); *H01L 2924/01033* (2013.01); *H01L 2924/01068* (2013.01); *H01L 2924/01075* (2013.01); *H01L 2924/01078* (2013.01); *H01L 2924/01079* (2013.01); *H01L 2924/01082* (2013.01); *H01L 2924/12041* (2013.01); *H01L 2924/12042* (2013.01); *H01L 2924/12044* (2013.01); *H01L 2924/1461* (2013.01); *H01L 2924/15311* (2013.01); *H01L 2924/181* (2013.01); *H01L 2924/19043* (2013.01)

(56) References Cited

U.S. PATENT DOCUMENTS

| 6,512,255 | B2* | 1/2003 | Aoki | G01L 19/147 257/254 |
|---|---|---|---|---|
| 2001/0028072 | A1 | 10/2001 | Aoki et al. | |
| 2004/0229031 | A1 | 11/2004 | Gell et al. | |
| 2006/0110842 | A1 | 5/2006 | Chang et al. | |
| 2007/0145606 | A1* | 6/2007 | Mahler | H01L 23/296 257/783 |
| 2008/0044488 | A1 | 2/2008 | Zimmer et al. | |
| 2010/0015737 | A1 | 1/2010 | Takayama et al. | |

FOREIGN PATENT DOCUMENTS

| DE | 102004047510 | 4/2006 |
|---|---|---|
| EP | 0349318 | 1/1990 |
| EP | 0354056 | 2/1990 |
| EP | 0535996 | 4/1993 |
| JP | 09153508 | 6/1997 |
| WO | 991220 | 3/1999 |
| WO | 2006048650 | 5/2006 |
| WO | 2006120449 | 11/2006 |

\* cited by examiner

SENSOR PACKAGE

CROSS-REFERENCE TO RELATED APPLICATIONS

This Utility Patent Application is a continuation of U.S. patent application Ser. No. 11/828,085, filed Jul. 25, 2007, which is incorporated herein by reference.

BACKGROUND

The invention relates to a sensor device and more particularly to the art of protecting a semiconductor sensor against environmental influences.

Conventionally, semiconductor sensors are mounted in a casing and are covered by a gel (often referred to as a globe top) which serves as a protection against water and other chemical media. Typically, relatively large amounts of gel are applied in order to guarantee a sufficient resistance against environmental attacks and a long durability. The gel closure, however, may alter or adversely effect the characteristics of the sensor or may cause other undesired effects.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
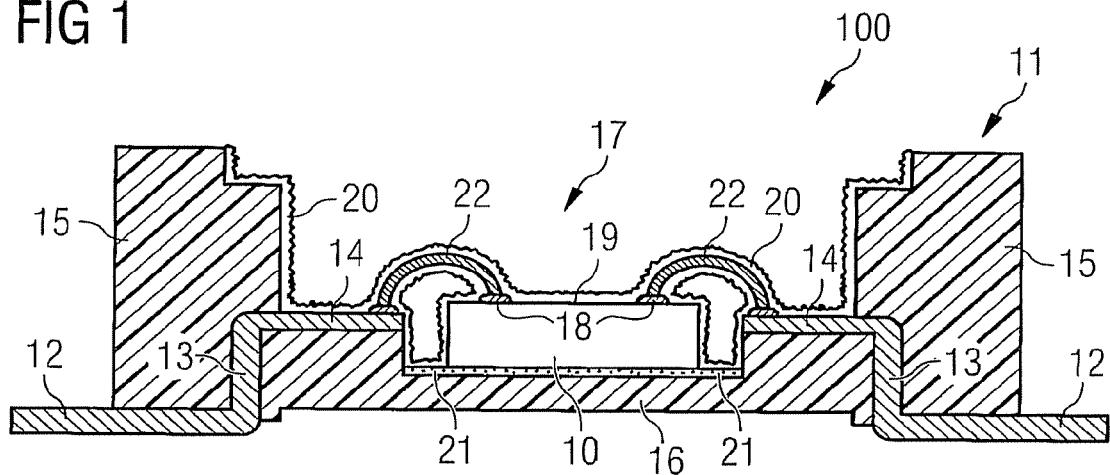
FIG. 1 illustrates a schematic cross-sectional illustration of a sensor device.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Semiconductor sensors described herein may, for example, be designed as pressure sensors, acceleration sensors, rotation sensors or microphones. Such and other sensors typically include a movable member and may be equipped with integrated electronic circuits which, for example, process signals that are produced or modulated by the movable member. The movable member may be produced from semiconductor materials and may be an integral part of a semiconductor sensor chip or it may be made of other materials, such as for example metal or plastics. In the literature, combinations of mechanical elements and sensors with electronic circuitry in a semiconductor chip are often referred to as an MEMS (Micro-Electro-Mechanical System). In the following description, semiconductor sensors may also be sensors without a movable member such as e.g., magnetic or electric field sensors or optical sensors. The semiconductor material may be silicon, but it is also possible to use any other semiconductor material such as compound semiconductors, e.g., III/V semiconductors.

Protective layers as will be described further below are materials which typically have a high barrier effect against hydrogen ingress and/or the attack of other chemical media which might result in corrosion or degradation of sensitive surface structures of the sensor device. By way of example, the protective layer may include semiconductor oxide and/or metal oxide materials such as silicate ($Si_yO_x$), e.g., $SiO_2$, or $Al_2O_3$, $B_2O_3$, $GeO_2$, $In_2O_3$, $PbO$, $Sb_2O_4$, $Sb_4O_6$, $SnO$, $SnO_2$, $SrO$, $Te_2O_5$, $TeO_2$, $TeO_3$, $Tl_2O_3$ or $ZnO$.

The layer thickness of the protective layer may be chosen dependent on a variety of parameters such as the layer material, the required resistance against chemical attack, the field of application etc. A minimum thickness of the protective layer may be about 5 or 10 nm. Often, a thickness of less than 400 nm or, more particularly, 100 nm is sufficient for achieving the wanted effects such as e.g., a sufficient resistance to corrosion. In other words, the protective layer is a thin surface coating deposited from the gas phase.

In FIG. 1, a sensor device is represented in cross-section as an exemplary embodiment. The sensor device 100 includes a semiconductor chip 10, an open cavity structure 11, external conductive terminals 12 and wire-bonds 22 serving as contact elements for electrically connecting the external conductive terminals 12 with the semiconductor chip 10.

The external conductive terminals 12 form part of a leadframe. As known in the art, a leadframe is a strip-like metal frame which includes a number of zones where semiconductor chips are to be mounted. At each such zone, a plurality of leads are suspended at the frame and protrude into the interior of the frame. During the manufacturing process, the open cavity structure 11 is molded to the leadframe and the frame is then cut-off from leads 13. Leads 13 of the leadframe pass through a bottom part 16 of the open cavity structure 11 into the interior (i.e. the open cavity) 17 of the open cavity structure 11 and extend there into lead-posts 14. The wire-bonds 22 are bonded to the lead-posts 14 by known techniques such as wedge-bonding or ball-bonding and connect to chip pads 18, which are arranged on the upper surface 19 of the semiconductor chip 10.

The leads 12, 13, 14 of the leadframe, the wire-bonds 22 and the chip pads 18, amongst other materials used in the assembly, may be subject to corrosion if being unprotected. For instance, the leadframe may be made of Cu, Ni/NiP, Au, the chip pads 18 may e.g., be made of Al or Pt and the wire-bonds 22 may e.g., be made of Au, Cu, Al. Further, the upper surface of the semiconductor chip 10 is usually passivated with an insulating hard passivation layer (e.g., $Si_3N_4$) and may represent the active surface of the sensor chip 10, in which the functional elements of the sensor are implemented. As already mentioned, these functional elements (not illustrated) may be movable mechanical members such as a membrane, a tongue or a cantilever, light-sensitive or electric or magnetic field sensitive structures in combination with integrated circuitry. As depicted in FIG. 1, all these elements (i.e. the lead-posts 14, the wire-bonds 22, the chip pads 18 and the upper surface 19 of the semiconductor chip 10 containing the functional elements) of the sensor may partly or completely be coated with a thin barrier layer 20. Especially, the mechanically movable members may be coated by the barrier layer 20. The thickness of the barrier layer 20 may be smaller than the thickness of any movable member used in the sensor, e.g., a membrane, a tongue or a cantilever. Therefore, the transfer function of the sensor is not substantially effected by the barrier layer 20. It is further to be noted that the barrier layer 20 may be transparent so that it does not impede the performance of an optical sensor.

As a result of the protection of the surfaces coated by the barrier layer 20 in the interior of the open cavity structure 11, it is not necessary to apply any further protective material such as a gel or another padding material. In other words, the outer surface of the barrier layer 20 may remain exposed to the ambience.

The barrier layer 20 may be made of an inorganic material and may coat all exposed surfaces in the interior of the open cavity structure 11, i.e. also the inner surfaces of the side walls 15, the edges and side faces of the semiconductor chip 10 and the regions where the semiconductor chip 10 is fixed to the bottom part 16 of the open cavity structure 11 by e.g., an adhesive 21.

The inorganic barrier layer 20 may be made of a mineral material such as e.g., silicate or one or more of the aforementioned materials. As will be explained further below in more detail, the inorganic barrier layer 20 may be deposited from a precursor of metal-organic material or semiconductor-organic material containing the primary metal or semiconductor material of the barrier layer.

The open cavity structure 11 may be a mold compound made of plastics. For instance, thermosetting or thermoplastic resin materials may be used. There are various possibilities to attach the open cavity structure 11 to the leadframe (of which two leads 12, 13, 14 are depicted). Premold structures are molded to the leadframe prior to subsequent fabrication processes such as die (i.e. chip) attach and die bonding. Such premold structures may be manufactured by using an injection molding process, in which the leadframe is clamped into an injection molding tool used in an injection molding machine. Alternatively, it is possible to first carry out the manufacturing processes of die attach and wire bonding and then to attach the open cavity structure 11 to the assembly. In both cases, the inorganic barrier layer 20 is deposited after die attach and die bonding.

It is to be noted that other bonding techniques such as e.g., ribbon bonding or clip bonding may either be used. Further, other metallic materials or conductive polymeric materials may be used for the contact elements within the open cavity structure 11. Further, it is to be noted that the leads 12, 13, 14 may be of any desired shape and may e.g., pass into the open cavity structure 11 by protruding through the side walls 15 rather than through the bottom part 16 of the open cavity structure 11.

Figure 2:
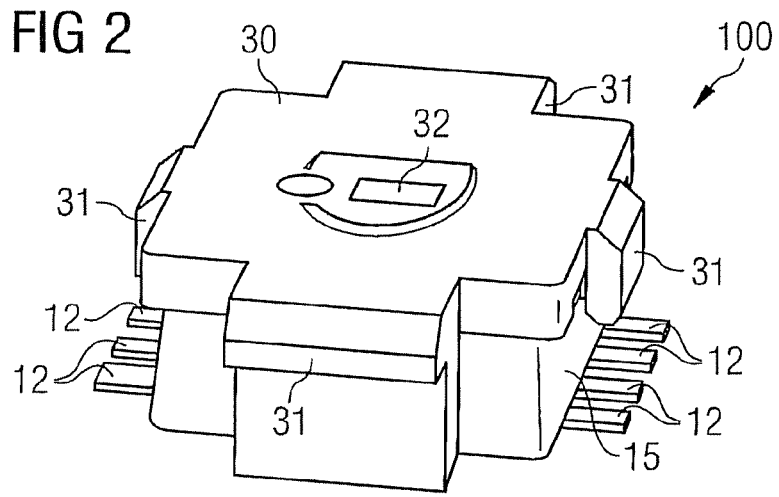
FIG. 2 is a perspective illustration of the sensor device illustrated in FIG. 1.

FIG. 2 illustrates a perspective representation the outer appearance of the sensor device 100 illustrated in FIG. 1. In this example, the open cavity structure 11 is a DSOF (Dual Small Outline Flat), SMD (Surface Mounted Device) housing which is closed by a cap 30. The cap 30 is snapped into place by locking mechanism or locking means 31 interacting with the open cavity structure 11 and may include an opening 32. Here, the sensor is developed for measurement of barometric air pressure (BAP), but similar packages can also be used for any of the sensor types mentioned further above.

Usual dimensions of the semiconductor device 100 are a few up to tens of millimeters in all three dimensions. By way of example, a DSOF-8-12 package has a footprint of 8.6×7.0 mm and a height of 2.8 mm.

Figure 3:
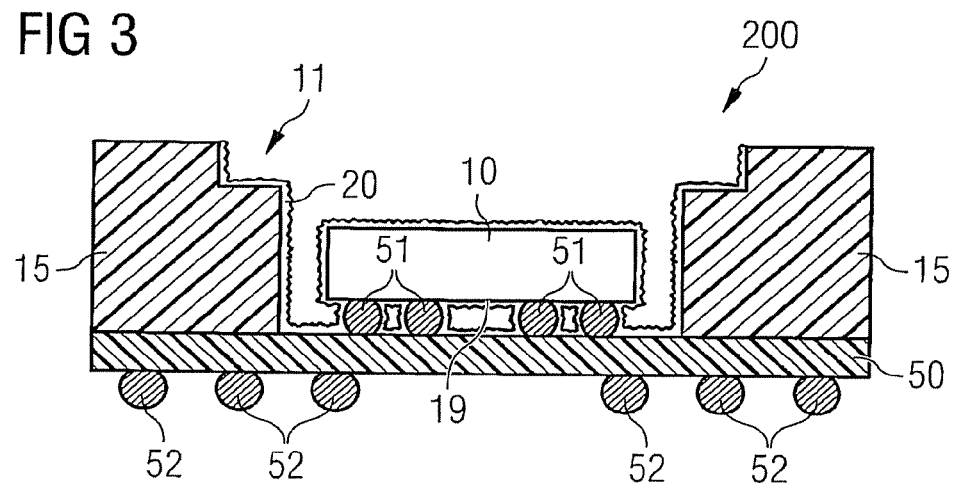
FIG. 3 illustrates a schematic cross-sectional illustration of another sensor device.

FIG. 3 illustrates a further embodiment, in which like parts are denoted by the same reference signs. In the sensor device 200, the semiconductor chip 10 is mounted in a face-down-orientation on a substrate 50 which forms the bottom part of the semiconductor device 200. In such flip-chip type package, the active surface 19 of the semiconductor chip 10 faces the substrate 50. An opening (not illustrated) may be formed in the substrate 50 to expose the active surface 19 to an external action to be measured such as e.g., barometric pressure, sonic vibrations or light. Solder balls 51 are applied in a peripheral region to the active surface 19 of the semiconductor chip 10 and serve as contact elements to electrically connect the substrate 50 to the semiconductor chip 10. Further, solder balls 52 or other contact elements may be attached to the outer surface of the substrate 50 and are interconnected with the chip solder balls 51 by an internal metallic redistribution layer not illustrated in FIG. 3.

Similar to the first embodiment, all exposed surfaces in the interior of the open cavity structure 11 may be coated with the inorganic barrier layer 20. By using techniques which will be explained in more detail below, it is possible to also apply the inorganic barrier layer 20 to surfaces located between the semiconductor chip 10 and the substrate 50, e.g., to the active surface 19 of the semiconductor chip 10, to the surface of solder balls 51 and to metallizations such as chip pads (not illustrated) and corresponding contact areas on the inner surface of the substrate 50.

Figure 4:
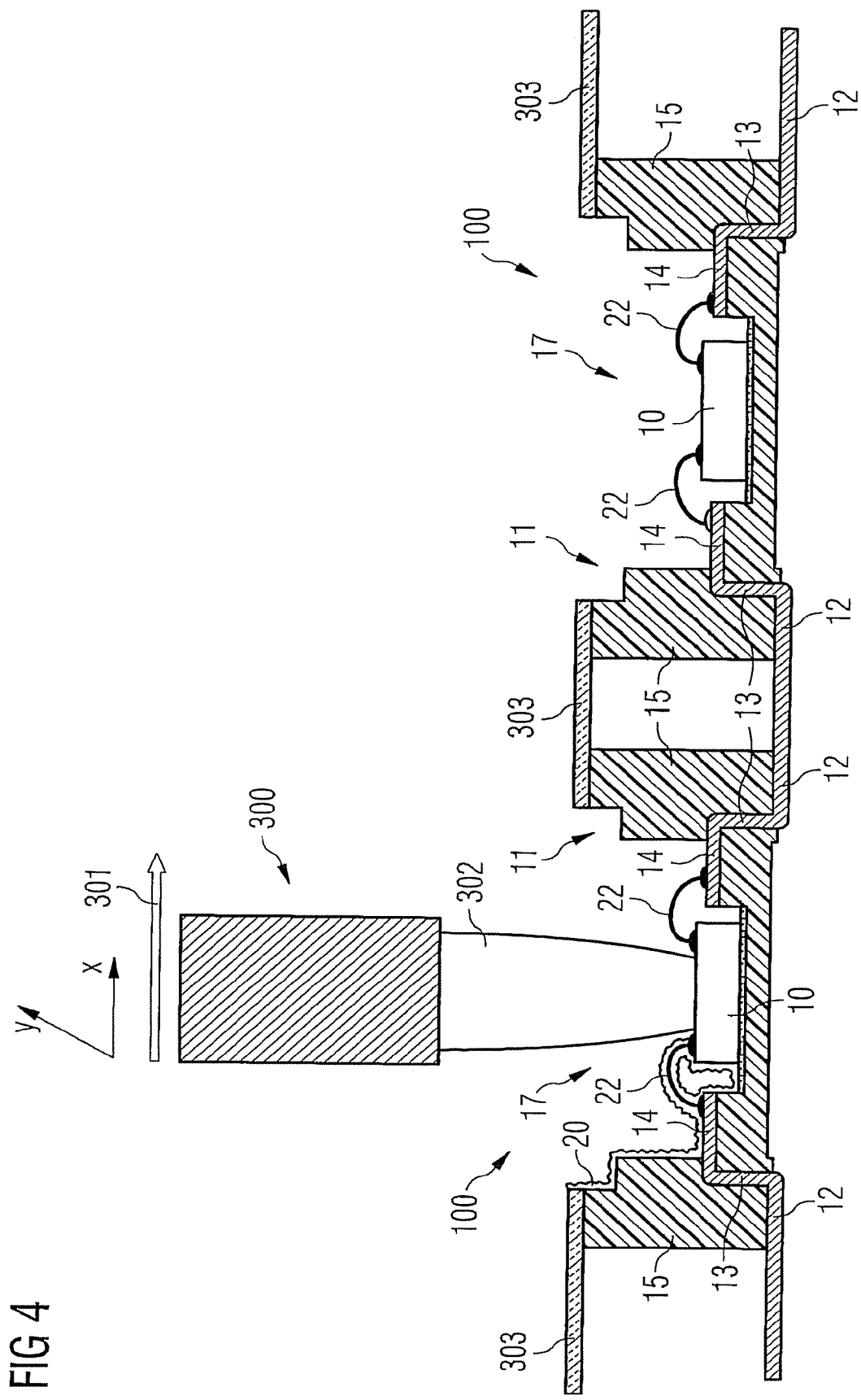
FIG. 4 illustrates a cross-sectional illustration of a leadframe on which semiconductor sensors are mounted in open cavity structures.

Various methods may be used for depositing the inorganic barrier layer 20, including CVD (Chemical Vapor Deposition) and PVD (Physical Vapor Deposition) techniques, e.g., sputtering, thermal evaporation, laser deposition, cathodic arc deposition. As a first example, a plasma nozzle method will be described. In this method, the inorganic barrier layer 20 is deposited from a gas phase onto the exposed surfaces by a spray process as illustrated in FIG. 4. To this end, a plasma generator 300 is moved over a continuous, strip-like leadframe with attached open cavity structures 11 and mounted semiconductor chips 10. Here, the length extension of the leadframe is in Y direction and the width of the leadframe is in X direction indicated by arrow 301—i.e. two semiconductor chips 10 may be mounted next to one another on the leadframe. The plasma generator 300 discharges a plasma 302 which is directed to the interior 17 of the open cavity structure 11. It is to be noted that the plasma treatment of the sensor devices 100 also provides for an initial cleaning of the surfaces to be coated. In order to arrive at a sufficient thickness of the inorganic barrier layer 20, the plasma generator 300 may perform several sweeping movements in transversal X direction (which is perpendicular to the longitudinal Y direction). Thus, the surfaces to be coated are exposed to the plasma beam 302 for several times. In order to avoid the exposure of surfaces to the plasma beam 302 which are not intended to be coated with the inorganic barrier layer 20, mask plates 303 may be used. In the example illustrated in FIG. 4, the upper surfaces of the external conductive terminals 12 which project beyond the outline of the open cavity structure 11 shall not be coated and are therefore protected by the mask plates 303. Such mask plates 303 may also be useful to protect areas of the sensor device 100 which are short distant to the plasma generator 300 and thus more exposed to heat from the plasma beam 302, especially if the plasma generator 300 is configured as a blow pipe operable to be used as a flame pyrolysis plasma generator 300.

Virtually all known methods may be used for plasma generation. More specifically, plasma generation in the plasma generator 300 may e.g., be effected by a pyrolysis method, by a method based on electrical and/or magnetical fields such as microwave or by a method based on laser dissociation. The plasma generator 300 may be designed to generate an atmosphere plasma or a low pressure plasma.

Figure 5:
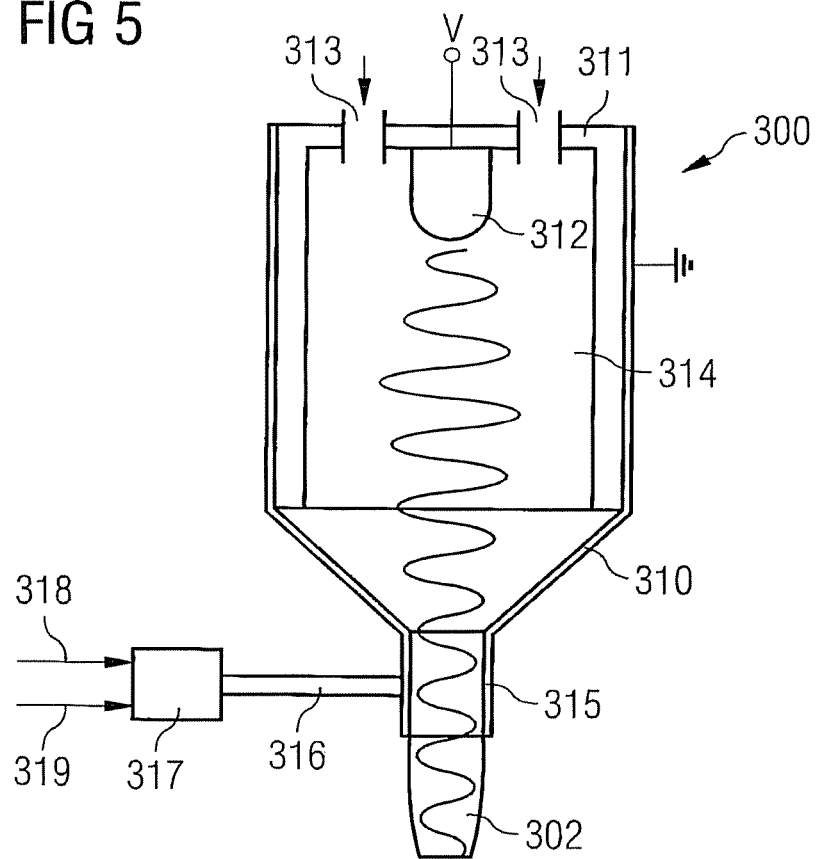
FIG. 5 illustrates a schematic diagram of a nozzle plasma generator.

According to FIG. 5, by way of example, a plasma generator 300 may include a metal enclosure 310 connected to a first potential (e.g., ground), a housing 311 made of an insulating material and an electrode 312 connected to a second potential V. Feed-through inlets 313 leading to an ionization chamber 314 are provided to feed ionization gas into an ionization chamber defined by the insulating housing 311 and the metal envelope 310. Opposite to the electrode 312, the metal envelope 310 has a tapered shape and ends into a nozzle 315. An inlet 316 to the nozzle 315 is connected to a vaporizer or mixer 317. The vaporizer or mixer 317 receives a carrier gas through line 318 and a precursor through line 319.

The plasma generator 300 illustrated in FIG. 5 may be configured to generate an atmosphere plasma which is induced by an alternating electrical field. Other types of plasma generation which may be utilized in the plasma generator 300 are flame pyrolysis plasma generation, magnetic field plasma generation, laser beam plasma generation, microwave plasma generation etc. In all cases, a nozzle type atmosphere plasma spray generator similar to that illustrated in FIG. 5 may be employed. No airtight setup casing is needed if an atmosphere plasma generation method is used.

Figure 6:
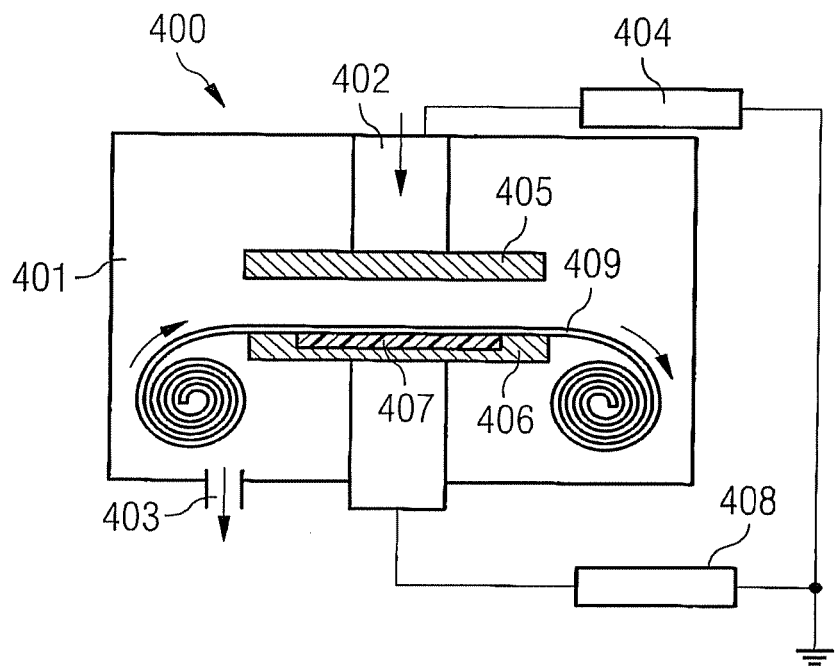
FIG. 6 illustrates schematic diagram of a plasma enhanced chemical vapor deposition system.

According to FIG. 6, the inorganic barrier layer 20 may also be deposited in a low pressure plasma process. By way of example, an apparatus 400 for generating a low pressure plasma is illustrated schematically in FIG. 6. The apparatus 400 includes a chamber 401 having a gas inlet 402 and a gas outlet 403. A power supply 404 is connected to an upper electrode (e.g., a showerhead anode) 405 of the apparatus 400. A lower electrode (cathode) 406 is arranged opposite to the upper electrode 405 and may be provided with a cooling well 407. A power supply 408 is coupled to the lower anode 406. A strip-like leadframe 409 such as depicted in FIG. 4 is transported by using a wheel-to-wheel process through the gap between the two electrodes 405, 406.

Apparatus 400 may be designed as a PECVD (Plasma Enhanced Chemical Vapor Deposition) system. Similar to atmosphere plasma generation, e.g., electric fields, magnetic fields, microwave or light may be used for plasma generation. The precursor along with possibly other gaseous components such as for instance a carrier gas are supplied through the inlet 402 and discharged at the outlet 403. The pressure used in the chamber 401 depends on various parameters such as the plasma generation method, the desired barrier layer thickness and so on and may typically be within the range of 0.1 mbar to one or several mbar. A similar apparatus may be used when a PVD method for depositing the barrier layer 20 is employed.

Further, it is to be noted that several modifications to the apparatus 400 designed for low pressure deposition are possible. Instead of the wheel-to-wheel method, a batch process may be used, in which a magazine containing a plurality of sensor devices 110, 200 (which may already be separated or still be interconnected) is put on the lower electrode 406 and subjected to the low pressure plasma. After processing of one magazine, the chamber 401 is opened, the processed magazine is removed, a magazine with unprocessed sensor devices 110, 20 is inserted and the vacuum is re-established in order to resume the deposition process.

In both the atmosphere plasma and low pressure plasma CVD processes described before, an organometallic or organic semiconductor or organometallic semiconductor material may be used as a precursor for barrier layer deposition. By way of example, the following monomers may be applied. Commonly used short term designations are added in brackets: $C_6H_{18}OSi_2$ (HMDSO), $C_8H_{20}O_4Si$ (TEOS), $C_4H_{12}Si$ (TMS), $C_4H_{12}OSi_2$ (TMDS), $C_5H_{12}Osi$ (TMES), $C_6H_{18}Si_2$ (HMDS), $C_7H_{18}O_3Si$ (MTES), $C_4H_{12}O_3Si$ (MTMS), $C_5H_{12}O_3Si$ (VTMS), $Si(OCH_3)_2(CH_3)_2$ (DMDMOS), $CH_3Osi(CH_3)_3$ (TMMOS) and $CH_3Si(OCH_3)_3$ (MTMOS).

Figure 7:
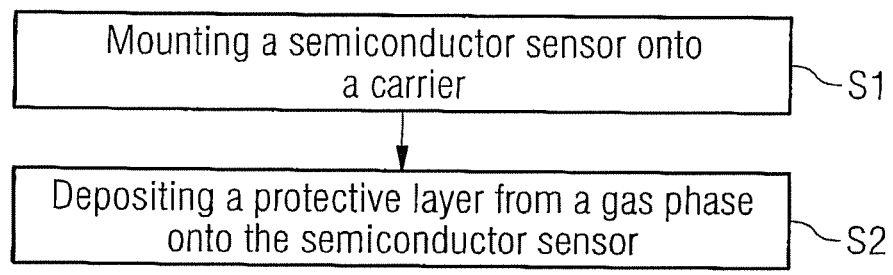
FIG. 7 illustrates a flow chart illustrating a first method for manufacturing a sensor device.

FIG. 7 illustrates basic method processes used for manufacturing embodiments of a sensor device. In S1, the semiconductor sensor is mounted onto a carrier. As already mentioned, the mounting may include die attach and bonding. Bonding may e.g., be accomplished by one of the aforementioned bonding techniques.

Then, in S2, the barrier layer 20 is deposited from a gas phase onto the semiconductor sensor. Although thin, the barrier layer 20 may serve as an unique protection covering for instance all exposed surfaces within the interior 17 of the open cavity structure 11, resulting in that any other protective materials may not be needed.

Figure 8:
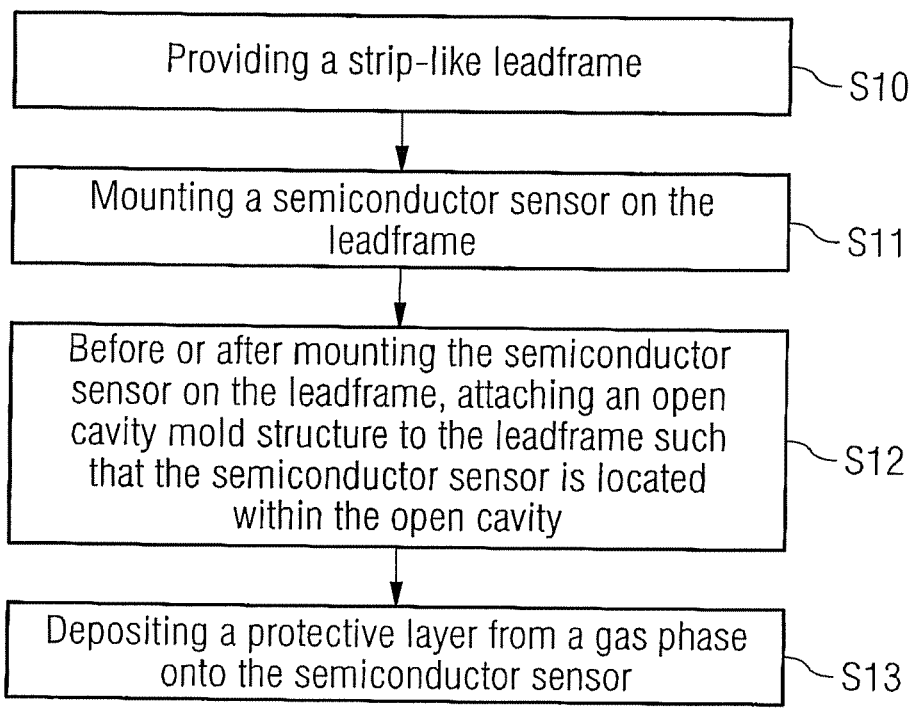
FIG. 8 illustrates a flow chart illustrating another method for manufacturing a sensor device.

According to FIG. 8, in S10 a strip-like leadframe is provided. Then, the semiconductor sensor, e.g., semiconductor chip 10, is mounted on the leadframe, cf. S11. Typically, not only one but a plurality of semiconductor sensors are mounted. An open cavity mold structure is attached to the leadframe such that the semiconductor sensor is located within the open cavity according to S12. Again, typically each semiconductor sensor is accommodated in such open cavity structure. S12 may be accomplished before or after S11. Then, the barrier layer 20 is deposited from a gas phase onto the semiconductor sensor(s) (S13).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package comprising:
   a carrier;
   a semiconductor sensor coupled to the carrier; and
   a protective layer made of an oxide material covering at least a portion of the semiconductor sensor, the semiconductor sensor disposed within an interior of an unfilled open cavity structure, the semiconductor sensor and walls of the interior of open cavity structured covered with only the protective layer such that all portion of an exterior surface of the protective layer are exposed.

2. The package of claim 1, wherein the protective layer is made of a metal oxide.

3. The package of claim 1, wherein the protective layer is made of a compound of oxide materials.

4. The package of claim 1, wherein the protective layer has a thickness in the range of 5 nm to 400 nm.

5. The package of claim 1, comprising:
a mechanism that electrically couples the semiconductor sensor to the carrier; and
where the protective layer covers at least a portion of the semiconductor sensor and the mechanism.

6. The package of claim 5, where the mechanism includes a wire bond.

7. The package of claim 5, where the mechanism includes a solder ball.

8. A semiconductor device comprising:
a carrier;
a semiconductor sensor comprising a bottom side and a side wall adjoining the bottom side, the semiconductor sensor coupled to the carrier such that the bottom side faces the carrier;
wire-bonds electrically connecting the carrier with the semiconductor sensor;
a protective layer made of organic semiconductor material including an oxide, covering at least a portion of the semiconductor sensor and directly contacting the wire-bonds and covering and in direct contact with side walls of the semiconductor sensor, and where the protective layer has a thickness in the range of 5 nm to 400 nm, wherein all portions of an exterior surface of the protective layer are exposed.

9. The device of claim 8, wherein the organic material is an organometallic material.

10. A sensor device, comprising:
a carrier;
a semiconductor sensor mounted on the carrier and having an active surface and a side wall;
contact elements electrically connecting the carrier with the semiconductor sensor;
a protective layer made of an oxide material covering the active surface and directly contacting the contact elements, and covering and in direct contact with the side wall of the semiconductor sensor where the protective layer has a thickness in the range of 5 nm to 400 nm, wherein all portions of an exterior surface of the protective layer are exposed.

11. The sensor device of claim 10, wherein the protective layer further covers conductive contact elements of the carrier.

12. The sensor device of claim 10, wherein the active surface of the semiconductor sensor comprises a movable member.

13. The sensor device of claim 12, wherein the movable member is a membrane or a tongue or a cantilever.

14. The sensor device of claim 12, wherein the protective layer is thinner than the movable member.

15. The sensor device of claim 10, wherein the semiconductor sensor is one of the group of pressure sensor, microphone and acceleration sensor.

16. The sensor device of claim 10, wherein the protective layer has a thickness in the range of 10 nm to 100 nm.

17. The sensor device of claim 10, wherein the protective layer is made of a metal oxide or a compound of the oxides.

18. The sensor device of claim 10, wherein the protective layer is made of a silicate.

19. The sensor device of claim 10, further comprising:
an open cavity structure attached to the carrier, wherein the semiconductor sensor is arranged within the open cavity structure.

* * * * *